US007338741B2

(12) United States Patent
Aoshima et al.

(10) Patent No.: US 7,338,741 B2
(45) Date of Patent: Mar. 4, 2008

(54) LITHOGRAPHIC PRINTING PLATE PRECURSOR AND LITHOGRAPHIC PRINTING METHOD

(75) Inventors: Norio Aoshima, Shizuoka (JP); Yoshinori Hotta, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 123 days.

(21) Appl. No.: 10/870,040

(22) Filed: Jun. 18, 2004

(65) Prior Publication Data

US 2004/0265736 A1 Dec. 30, 2004

(30) Foreign Application Priority Data

Jun. 25, 2003 (JP) .......................... P.2003-181073

(51) Int. Cl.
*G03F 7/00* (2006.01)
*G03F 7/004* (2006.01)

(52) U.S. Cl. .................. 430/270.1; 430/302; 430/303; 428/654; 205/214

(58) Field of Classification Search ............. 430/270.1, 430/302, 303; 428/654; 205/214
See application file for complete search history.

(56) References Cited

U.S. PATENT DOCUMENTS

| | | | | |
|---|---|---|---|---|
| 3,181,461 | A * | 5/1965 | Fromson | 430/275.1 |
| 4,555,475 | A * | 11/1985 | Gamson et al. | 430/309 |
| 6,387,595 | B1 * | 5/2002 | Teng | 430/302 |
| 6,482,571 | B1 * | 11/2002 | Teng | 430/302 |
| 6,494,137 | B2 * | 12/2002 | Sawada et al. | 101/459 |
| 6,568,325 | B2 * | 5/2003 | Sawada et al. | 101/459 |
| 6,709,800 | B2 * | 3/2004 | Fujita et al. | 430/270.1 |
| 6,764,587 | B2 * | 7/2004 | Sawada et al. | 205/214 |
| 6,777,155 | B2 * | 8/2004 | Oshima | 430/157 |
| 6,789,480 | B2 * | 9/2004 | Vander Aa et al. | 101/467 |
| 6,808,864 | B2 * | 10/2004 | Sawada et al. | 430/277.1 |
| 2002/0051929 | A1 | 5/2002 | Watanabe et al. | |
| 2003/0044714 | A1 * | 3/2003 | Teraoka et al. | 430/138 |
| 2003/0068575 | A1 | 4/2003 | Yanaka | |
| 2004/0053163 | A1 * | 3/2004 | Fujita | 430/270.1 |

FOREIGN PATENT DOCUMENTS

| | | | |
|---|---|---|---|
| EP | 1078736 | A1 | 2/2001 |
| EP | 1147885 | A2 | 10/2001 |
| EP | 1176007 | A2 | 1/2002 |
| EP | 1182033 | A1 | 2/2002 |
| EP | 1287985 | A2 | 3/2003 |
| EP | 1300257 | A2 | 4/2003 |
| JP | 2938397 | B2 | 5/1997 |
| JP | 2001-277740 | A | 10/2001 |
| JP | 2001-277742 | A | 10/2001 |
| JP | 2002-287334 | A | 10/2002 |

* cited by examiner

*Primary Examiner*—Amanda Walke
(74) *Attorney, Agent, or Firm*—Birch, Stewart, Kolasch & Birch, LLP

(57) ABSTRACT

A lithographic printing plate precursor comprises: an aluminum support that has been subjected to an alkali metal silicate treatment; and an image-recording layer comprising (A) an infrared absorbent, (B) a polymerization initiator and (C) a polymerizable compound, the image-recording layer being removable with at least one of a printing ink and a fountain solution, wherein the aluminum support has a surface where the amount of the Si element attached to the surface in the alkali metal silicate treatment is 1 $mg/m^2$ to less than 10 $mg/m^2$.

17 Claims, No Drawings

LITHOGRAPHIC PRINTING PLATE PRECURSOR AND LITHOGRAPHIC PRINTING METHOD

This Non-provisional application claims priority under 35 U.S.C. § 119(a) on Patent Application No(s). 2003-181073 filed in Japan on Jun. 25, 2003, the entire contents of which are hereby incorporated by reference.

BACKGROUND OF THE INVENTION

1. Field of the Invention

The present invention relates to a lithographic printing plate precursor and a lithographic printing plate method using the same. More specifically, the present invention relates to a lithographic printing plate precursor capable of directly producing a printing plate by scanning an infrared laser based on digital signals of a computer or the like, so-called direct plate-making, and a lithographic printing method of performing printing by developing this lithographic printing plate precursor on a printing press.

2. Description of the Related Art

The lithographic printing plate in general consists of a lipophilic image area of accepting an ink in the printing process and a hydrophilic non-image area of accepting a fountain solution. The lithographic printing method is a printing method utilizing the repellency between water and oily ink from each other, where the lipophilic image area of the lithographic printing plate and the hydrophilic non-image area are formed as an ink-receiving part and a fountain solution-receiving part (ink non-receiving part), respectively, to cause difference in the ink adhesion on the surface of the lithographic printing plate, an ink is attached only to the image area and thereafter, the ink is transferred to a material on which an image is printed, thereby performing printing.

For producing this lithographic printing plate, a lithographic printing plate precursor (PS plate) comprising a hydrophilic support having provided thereon a photo-sensitive resin layer (image-recording layer) has been heretofore widely used. Usually, a lithographic printing plate is obtained by a plate-making method where the lithographic printing plate precursor is exposed through an original image such as lith film and while leaving the image-recording layer in the image area, the image-recording layer in the non-image area is dissolved and removed with an alkaline developer or an organic solvent to expose the hydrophilic support to the surface.

In the plate-making process using a conventional lithographic printing plate precursor, a step of dissolving and removing the non-image area with a developer or the like according to the image-recording layer must be provided after exposure and as one problem to be solved, it is demanded to dispense with or simplify such an additive wet processing. In particular, the treatment of waste solutions discharged accompanying the wet processing is recently a great concern to the entire industry in view of consideration for global environment and the demand for solving the above-described problem is becoming stronger.

As one of simple plate-making methods, a method called on-press development has been proposed, where a recording layer enabling the removal of the non-image area of a lithographic printing plate precursor in a normal printing process is used and after exposure, the non-image area is removed on a printing press to obtain a lithographic printing plate.

The on-press development method specifically includes, for example, a method using a lithographic printing plate precursor having an image-recording layer dissolvable or dispersible in a fountain solution, an ink solvent or an emulsified product of fountain solution and ink, a method of mechanically removing the image-recording layer by the contact with an impression or blanket cylinder of a printing press, and a method of weakening the cohesion of the image-recording layer or adhesion between the image-recording layer and the support by the impregnation of a fountain solution, an ink solvent or the like and then mechanically removing the image-recording layer by the contact with an impression or blanket cylinder.

In the present invention, unless otherwise indicated, the "development processing step" indicates a step where by using an apparatus (usually an automatic developing machine) except for a printing press, the unexposed portion of the image-recording layer of a lithographic printing plate precursor is removed through the contact with a liquid (usually an alkaline developer) to expose the hydrophilic support surface, and the "on-press development" indicates a method or step where by using a printing press, the unexposed portion of the image-recording layer of a lithographic printing plate precursor is removed through the contact with a liquid (usually a printing ink and/or a fountain solution) to expose the hydrophilic support surface.

On the other hand, a digitization technique of electronically processing, storing and outputting image information by using a computer has been recently widespread and various new image-outputting systems coping with such a digitization technique have been put into practical use. Accompanying this, a computer-to-plate (CTP) technique is attracting attention, where digitized image information is carried on a highly converging radiant ray such as laser ray and a lithographic printing plate precursor is scan-exposed by this ray with no intervention of a lith film to directly produce a lithographic printing plate. Accordingly, one of important technical problems to be solved is to obtain a lithographic printing plate precursor suitable for such a technique.

As described above, the demand for a simplified, dry-system and non-processing plate-making work is ever-stronger in recent years from both aspects of consideration for global environment and adaptation for digitization.

However, when conventional image-recording systems using light in the region from ultraviolet to visible light are used for simplified plate-making work such as on-press development, the image-recording layer is not fixed even after exposure and the lithographic printing plate precursor possesses sensitivity to room light and therefore, must be kept in a completely light-shielded state after unpackaging until completion of the on-press development.

Recently, high-output lasers such as YAG laser and semiconductor laser of radiating an infrared ray at a wavelength of 760 to 1,200 nm are inexpensively available and a plate-making method using these high-output lasers for the light source on recording an image is promising as a method of producing a lithographic printing plate by scanning exposure which is easy to incorporate into a digitization technique.

In conventional plate-making methods using light in the region from ultraviolet to visible light, the image recording is performed by imagewise exposing a photosensitive lithographic printing plate precursor with low to middle intensity illuminance to cause a photochemical reaction in the image-recording layer and thereby imagewise change the physical properties. On the other hand, in the above-described method using a high-output laser, a large quantity of light energy is irradiated on the exposure region within an extremely short time to efficiently convert the light energy into heat energy and due to this heat, the image-recording layer undergoes chemical change, phase change or thermal change such as change of form or structure, which change is utilized in the image recording. Accordingly, the image information is inputted by light energy such as laser light, but the image recording is performed through a reaction by heat energy in addition to light energy. This recording system making use of heat generation by high-power density exposure is generally called heat-mode recording and the conversion of light energy into heat energy is called light-to-heat conversion.

The plate-making method using heat-mode recording is greatly advantageous in that the image-recording layer is not sensitive to light of normal illuminance level, such as room illumination, and fixing is not essential to the image recorded by high-intensity exposure. That is, the lithographic printing plate precursor for use in the heat-mode recording is safe to room light before exposure and fixing of the image after exposure is not essential. Accordingly, for example, when an image-recording layer which can be insolubilized or solubilized by exposure using a high-output laser is used and a plate-making process of imagewise removing the exposed image-recording layer to obtain a printing plate is performed by on-press development, this is expected to realize a printing system of causing no effect on an image even if the image is subjected to ambient light in a room after exposure. The realization thereof is demanded.

As such a lithographic printing plate precursor, for example, a lithographic printing plate precursor where an image-forming layer comprising a hydrophilic binder having dispersed therein hydrophobic thermoplastic polymer particles is provided on a hydrophilic support is known (see, for example, Japanese Patent No. 2,938,397). This lithographic printing plate precursor can be exposed by an infrared laser to cause coalescence of hydrophobic thermoplastic polymer particles due to heat and thereby form an image, then loaded on a cylinder of a printing press, and on-press developed by supplying a fountain solution and/or an ink.

However, in such a method of forming an image through coalescence by mere heat fusion of fine particles, the image strength is extremely low and the press life is not satisfied, despite good on-press developability.

As a technique of improving the press life, an on-press developable lithographic printing plate precursor comprising a hydrophilic support having thereon an image-recording layer containing a polymerizable compound-enclosing microcapsule is known (see, JP-A-2001-277740 and JP-A-2001-277742 (the term "JP-A" as used herein means an "unexamined published Japanese patent application")).

Also, an on-press developable lithographic printing plate precursor comprising a support having provided thereon a photosensitive layer containing an infrared absorbent, a radical polymerization initiator and a polymerizable compound is known (see, JP-A-2002-287334).

In these methods utilizing a polymerization reaction, the image density can be enhanced by virtue of high chemical bond density in the image area as compared with the image area formed by the heat fusion of polymer fine particles, but in view of practical use, the on-press developability and the press life are still not satisfied.

SUMMARY OF THE INVENTION

The present invention has been made with an aim to overcome those defects in conventional techniques. That is, an object of the present invention is to provide a lithographic printing plate precursor having good on-press developability and press life, and a lithographic printing method of performing printing by on-press developing this lithographic printing plate precursor.

The present inventors have made extensive studies on the silicate treatment which is one of hydrophilization treatments, and found that when the amount of an Si element attached to an aluminum support surface in the silicate treatment is controlled to fall within a predetermined range, both on-press developability and press life can be satisfied at the same time. The present invention has been accomplished based on this finding.

That is, the present invention is as follows.

(1) A lithographic printing plate precursor comprising: an aluminum support that has been subjected to an alkali metal silicate treatment; and an image-recording layer comprising (A) an infrared absorbent, (B) a polymerization initiator and (C) a polymerizable compound, the image-recording layer being removable with at least one of a printing ink and a fountain solution, wherein the aluminum support has a surface where the amount of the Si element attached to the surface in the alkali metal silicate treatment is 1 $mg/m^2$ to less than 10 $mg/m^2$.

(2) The lithographic printing plate precursor described in (1), wherein the Si element is attached to the surface of the aluminum support in an amount of 2 $mg/m^2$ to less than 10 $mg/m^2$.

(3) The lithographic printing plate precursor described in (1), wherein the Si element is attached to the surface of the aluminum support in an amount of 3 $mg/m^2$ to less than 10 $mg/m^2$.

(4) The lithographic printing plate precursor described in any of (1) to (3), wherein the aluminum support has a center line average roughness Ra of 0.10 to 1.2 μm.

(5) The lithographic printing plate precursor described in any of (1) to (4), wherein the aluminum support has a color density of 0.15 to 0.65.

(6) The lithographic printing plate precursor described in any of (1) to (5), wherein the image-recording layer is directly on the alkali metal silicate treated aluminum support.

(7) A lithographic printing method comprising: loading a lithographic printing plate precursor described in any of (1) to (6) on a printing press; imagewise exposing the lithographic printing plate precursor with an infrared laser to form an infrared laser-exposed portion and an infrared laser-unexposed portion of the image-recording layer; and printing by supplying a printing ink and a fountain solution to the lithographic printing plate precursor to remove the infrared laser-unexposed portion.

(8) The lithographic printing method described in (7), wherein the loading is performed before the imagewise exposing.

(9). The lithographic printing method described in (7), wherein the loading is performed after the imagewise exposing.

It is noted that the loading of the lithographic printing plate precursor to the printing press may be performed either before or after the imagewise exposing of the lithographic printing plate precursor.

DETAILED DESCRIPTION OF THE INVENTION

The present invention is described in detail below.

[Support]

The support for use in the lithographic printing plate precursor of the present invention is an alkali metal silicate-treated aluminum support and characterized in that the amount of an Si element attached to the aluminum support surface in the alkali metal silicate treatment is from 1 mg/$m^2$ to less than 10 mg/$m^2$.

The aluminum plate is a pure aluminum plate, an alloy plate mainly comprising aluminum and containing trace heteroelements, or an aluminum or aluminum alloy thin film laminated with a plastic. Examples of the heteroelement contained in the aluminum alloy include silicon, iron, manganese, copper, magnesium, chromium, zinc, bismuth, nickel and titanium. The heteroelement content in the alloy is preferably 10 mass % or less. In the present invention, a pure aluminum plate is preferred, but completely pure aluminum is difficult to produce in view of refining technique and therefore, an aluminum plate containing trace heteroelements may be used. The composition of the aluminum plate is not particularly specified and conventionally known and commonly employed materials can be appropriately used.

The thickness of the support is preferably from 0.1 to 0.6 mm, more preferably from 0.15 to 0.4 mm, still more preferably from 0.2 to 0.3 mm.

In advance of silicate treatment, the aluminum plate is preferably subjected to a surface treatment such as surface roughening and anodization. This surface treatment facilitates enhancing the hydrophilicity and ensuring the adhesion between the image-recording layer and the support. Before surface-roughening the aluminum plate, a degreasing treatment for removing the rolling oil on the surface is performed, if desired, by using a surfactant, an organic solvent, an alkaline aqueous solution or the like.

The surface-roughening treatment of the aluminum plate is performed by various methods and examples thereof include a mechanical surface-roughening treatment, a electrochemical surface-roughening treatment (surface-roughening treatment of electrochemically dissolving the surface) and a chemical surface-roughening treatment (a surface-roughening treatment of chemically and selectively dissolving the surface).

The mechanical surface-roughening treatment may be performed by using a known method such as ball polishing, brush polishing, blast polishing and buff polishing.

The method for the electrochemical surface-roughening treatment includes, for example, a method of passing an alternating or direct current in an electrolytic solution containing an acid such as hydrochloric acid or nitric acid. Also, a method using a mixed acid described in JP-A-54-63902 may be used.

The surface-roughened aluminum plate is, if desired, subjected to an alkali etching treatment using an aqueous solution of potassium hydroxide, sodium hydroxide or the like and after a neutralization treatment, further subjected to an anodization treatment, if desired, to enhance the abrasion resistance.

As for the electrolyte for use in the anodization treatment of the aluminum plate, various electrolytes of forming a porous oxide film may be used. In general, sulfuric acid, hydrochloric acid, oxalic acid, chromic acid or a mixed acid thereof is used. The concentration of the electrolyte is determined appropriately in accordance with the kind of the electrolyte.

The anodization treatment conditions vary depending on the electrolyte used and therefore, cannot be indiscriminately specified, however, in general, the concentration of electrolyte in the solution is from 1 to 80 mass %, the liquid temperature is from 5 to 70° C., the current density is from 5 to 60 A/$dm^2$, the voltage is from 1 to 100 V, and the electrolysis time is from 10 seconds to 5 minutes. The amount of the anodic oxide film formed is preferably from 1.0 to 5.0 g/$m^2$, more preferably from 1.5 to 4.0 g/$m^2$. Within this range, good press life and good scratch resistance in the non-image area of the lithographic printing plate can be obtained.

The aluminum plate subjected to the anodization treatment is then subjected to a hydrophilization treatment by an alkali metal silicate method. This is a method of dipping or electrolyzing the support in an aqueous solution of sodium silicate or the like and details thereon are described in U.S. Pat. Nos. 2,714,066, 3,181,461, 3,280,734 and 3,902,734. By this treatment, the hydrophilicity on the aluminum plate surface is improved, the non-image area is prevented from background staining, the resistance against scumming at printing is increased (for example, the water width is enlarged), the removability of the image-recording layer is enhanced and particularly in the case of on-press development, a good printed matter can be quickly obtained.

These effects are considered to result because the fountain solution on a printing press comes to readily penetrate into the interface between the image recording layer and the aluminum plate. In other words, the fountain solution readily penetrates into the image-recording layer and as compared with a microcapsule-type image-recording layer which is dispersed in a fountain solution and thereby on-press developed, a greater effect can be obtained on the on-press developability in the case of a uniform image-recording layer which is on-press developed by defilming.

The amount of silicate attached to the aluminum plate surface can be arbitrarily controlled by the treatment conditions. For example, the amount attached can be increased by using a high-concentration sodium silicate, setting the treating solution temperature at a high temperature, or prolonging the treatment time. The amount attached is determined by a method where the Kα ray intensity of Si element is measured by a fluorescent X ray and the amount attached is quantitatively determined by using a calibration curve obtained by previously measuring a material having a known Si element amount.

The present invention is characterized in that the amount of Si element attached to the aluminum support surface as determined by this method is from 1 mg/$m^2$ to less than 10 mg/$m^2$. The amount of Si element attached is preferably from 2 mg/$m^2$ to less than 10 mg/$m^2$, more preferably from 3 mg/$m^2$ to less than 10 mg/$m^2$.

Within this range, excellent hydrophilicity, excellent on-press developability and excellent adhesion between image-recording layer and aluminum support can be obtained. If the amount added is less than 1 mg/$m^2$, this is too small and sufficient hydrophilicity cannot be obtained, as a result, background staining of non-image area may be generated or on-press development of the image-recording layer may fail. On the other hand, if the amount is 10 mg/$m^2$ or more, this is excessively large and the adhesive strength between image-recording layer and aluminum support decreases, as a result, the image area cannot have sufficiently high durability.

The support preferably has a center line average roughness Ra of 0.10 to 1.2 μm. Within this range, good adhesion to the image-recording layer, good press life and good scumming resistance can be obtained.

The color density of the support is preferably from 0.15 to 0.65 in terms of the reflection density value. Within this range, good image-forming property by virtue of antihalation at the image exposure and good suitability for plate inspection after development can be obtained.

Incidentally, in the lithographic printing plate precursor of the present invention, an undercoat layer or interlayer provided between the image-recording layer and the support, which is described, for example, in JP-A-10-282679 and JP-A-2002-287334, may be used without impairing the hydrophilicity on the support surface imparted by silicate.

[Image-Recording Layer]

The image-recording layer of the lithographic printing plate precursor of the present invention comprises (A) an infrared absorbent, (B) a polymerization initiator and (C) a polymerizable compound and can be removed with a printing ink and/or a fountain solution. Each constituent component of the image-recording layer is described below.

((A) Infrared Absorbent)

The image-recording layer of the present invention contains an infrared absorbent so that the image formation using, as a light source, a laser of emitting an infrared ray at 760 to 1,200 nm can be efficiently performed. The infrared absorbent has a function of converting the absorbed infrared ray into heat. Due to the heat generated, the polymerization initiator (radical generator) described later undergoes thermal decomposition and generates a radical. This infrared absorbent for use in the present invention is a dye or pigment having an absorption maximum in the wavelength range from 760 to 1,200 nm.

As the dye, commercially available dyes and known dyes described in publications, for example, Senryo Binran (Handbook of Dyes), compiled by Yuki Gosei Kagaku Kyokai (1970), may be used. Specific examples thereof include dyes such as azo dye, metal complex salt azo dye, pyrazolone azo dye, naphthoquinone dye, anthraquinone dye, phthalocyanine dye, carbonium dye, quinoneimine dye, methine dye, cyanine dye, squarylium dye, pyrylium salt, and metal thiolate complex.

Preferred examples of the dye include cyanine dyes described in JP-A-58-125246, JP-A-59-84356 and JP-A-60-78787, methine dyes described in JP-A-58-173696, JP-A-58-181690 and JP-A-58-194595, naphthoquinone dyes described in JP-A-58-112793, JP-A-58-224793, JP-A-59-48187, JP-A-59-73996, JP-A-60-52940 and JP-A-60-63744, squarylium dyes described in JP-A-58-112792, and cyanine dyes described in British Patent 434,875.

Also, the near infrared absorbing sensitizers described in U.S. Pat. No. 5,156,938 may be suitably used. Furthermore, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium-base compounds described in JP-A-58-181051, JP-A-58-220143, JP-A-59-41363, JP-A-59-84248, JP-59-84249, JP-A-59-146063 and JP-A-59-146061, cyanine dyes described in JP-A-59-216146, pentamethinethiapyrylium salts described in U.S. Pat. No. 4,283,475, and pyrylium compounds described in JP-B-5-13514 (the term “JP-B” as used herein means an “examined Japanese patent publication”) and JP-B-5-19702 may also be preferably used. Other preferred examples of the dye include the near infrared absorbing dyes represented by formulae (I) and (II) of U.S. Pat. No. 4,756,993.

Still other preferred examples of the infrared absorbent for use in the present invention include specific indolenine cyanine dyes described in JP-A-2002-278057.

Among these dyes, particularly preferred are cyanine dye, squarylium dye, pyrylium salt, nickel thiolate complex and indolenine cyanine dye, more preferred are cyanine dye and indolenine cyanine dye, still more preferred is the cyanine dye represented by the following formula (i):

Formula (i):

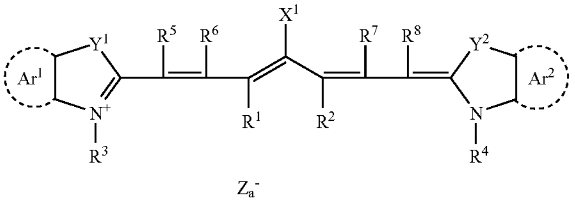

In formula (i), $X^1$ represents a hydrogen atom, a halogen atom, —$NPh_2$, $X^2$-$L^1$ or a group shown below:

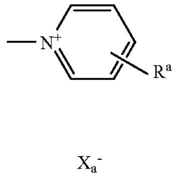

wherein $X^2$ represents an oxygen atom, a nitrogen atom or a sulfur atom and $L^1$ represents a hydrocarbon group having from 1 to 12 carbon atoms, an aromatic ring having a heteroatom, or a hydrocarbon group having from 1 to 12 carbon atoms and containing a heteroatom, the heteroatom as used herein includes N, S, O, a halogen atom and Se, $X_a^-$ has the same definition as $Z_a^-$ described later, and $R^a$ represents a substituent selected from a hydrogen atom, an alkyl group, an aryl group, a substituted or unsubstituted amino group and a halogen atom.

$R^1$ and $R^2$ each independently represents a hydrocarbon group having from 1 to 12 carbon atoms. In view of storage stability of the coating solution for the recording layer, $R^1$ and $R^2$ each is preferably a hydrocarbon group having 2 to more carbon atoms and $R^1$ and $R^2$ are more preferably combined with each other to form a 5- or 6-membered ring.

$Ar^1$ and $Ar^2$ may be the same or different and each represents an aromatic hydrocarbon group which may have a substituent. Preferred examples of the aromatic hydrocarbon group include a benzene ring and a naphthalene ring, and preferred examples of the substituent include a hydrocarbon group having 12 or less carbon atoms, a halogen atom and an alkoxy group having 12 or less carbon atoms. $Y^1$ and $Y^2$ may be the same or different and each represents a sulfur atom or a dialkylmethylene group having 12 or less. carbon atoms. $R^3$ and $R^4$ may be the same or different and each represents a hydrocarbon group having 20 or less carbon atoms, which may have a substituent. Preferred examples of the substituent include an alkoxy group having 12 or less carbon atoms, a carboxyl group and a sulfo group. $R^5$, $R^6$, $R^7$ and $R^8$ may be the same or different and each represents a hydrogen atom or a hydrocarbon group having 12 or less carbon atoms, and in view of availability of the r a w material, preferably a hydrogen atom. $Z_a^-$ represents a counter anion, but when the cyanine dye represented by formula (i) has an anionic substituent in its structure and neutralization of electric charge is not necessary, $Z_a^-$ is not present. In view of storage stability of the coating solution for the recording layer, $Z_a^-$ is preferably halide ion, perchlorate ion, tetrafluoroborate ion, hexafluoro-phosphate ion or sulfonate ion, more preferably perchlorate ion, hexafluorophosphate ion or arylsulfonate ion.

Specific examples of the cyanine dye represented by formula (i), which can be suitably used in the present invention, include those described in paragraphs [0017] to [0019] of JP-A-2001-133969.

Particularly preferred examples include specific indolenine cyanine dyes described in JP-A-2002-278057.

As the pigment for use in the present invention, commercially available pigments and pigments described in Color Index (C.I.) Binran (C.I. Handbook), Saishin Ganryo Binran (Handbook of Newest Pigments), compiled by Nippon Ganryo Gijutsu Kyokai (1977), Saishin Ganryo Oyo Gijutsu (Newest Pigment Application Technology), CMC Shuppan (1986), and Insatsu Ink Gijutsu (Printing Ink Technology), CMC Shuppan (1984) can be used.

The kind of pigment includes black pigment, yellow pigment, orange pigment, brown pigment, red pigment, violet pigment, blue pigment, green pigment, fluorescent pigment, metal powder pigment and polymer bond pigment. Specific examples of the pigment which can be used include insoluble azo pigments, azo lake pigments, condensed azo pigments, chelate azo pigments, phthalocyanine-base pigments, anthraquinone-base pigments, perylene- and perynone-base pigments, thioindigo-base pigments, quinacridone-base pigments, dioxazine-base pigments, isoindolinone-base pigments, quinophthalone-base pigments, dyed lake pigments, azine pigments, nitroso pigments, nitro pigments, natural pigments, fluorescent pigments, inorganic pigments and carbon black. Among these pigments, carbon black is preferred.

These pigments may or may not be surface-treated before use. Examples of the method for surface treatment include a method of coating the surface with resin or wax, a method of attaching a surfactant, and a method of bonding a reactive substance (for example, silane coupling agent, epoxy compound or isocyanate) to the pigment surface. These surface-treatment methods are described in Kinzoku Sekken no Seishitsu to Oyo (Properties and Application of Metal Soap), Saiwai Shobo, Insatsu Ink Gijutsu (Printing Ink Technology), CMC Shuppan (1984), and Saishin Ganryo Oyo Gijutsu (Newest Pigment Application Technology), CMC Shuppan (1986).

The particle size of the pigment is preferably from 0.01 to 10 μm, more preferably from 0.05 to 1 μm, still more preferably from 0.1 to 1 μm. Within this range, good stability of the pigment dispersion in the coating solution for the image-recording layer and good uniformity of the image-recording layer can be obtained.

For dispersing the pigment, a known dispersion technique used in the production of ink or toner may be used. Examples of the dispersing machine include ultrasonic disperser, sand mill, attritor, pearl mill, super-mill, ball mill, impeller, disperser, KD mill, colloid mill, dynatron, three-roll mill and pressure kneader. These are described in detail in Saishin Ganryo Oyo Gijutsu (Newest Pigment Application Technology), CMC Shuppan (1986).

In the image-recording layer, this infrared absorbent is contained in an amount of 1 to 5 mass %, preferably from 1 to 4 mass %, more preferably from 1 to 3 mass %, based on the entire solid content of the image-recording layer. Within this range, good sensitivity can be obtained.

((B) Polymerization Initiator)

The polymerization initiator which can be used in the present invention generates a radical by using both energies of heat and light and thereby initiates and conducts the curing reaction of a polymerizable compound which is described later. Accordingly, a decomposition-type radical generator of undergoing decomposition due to heat to generate a radical is useful as the polymerization initiator. When this radical generator is used in combination with the above-described infrared absorbent, the ultraviolet absorbent generates heat upon irradiation with an infrared laser and a radical is generated due to the heat. By this combination, heat-mode recording can be realized.

Examples of the radical generator include onium salt, triazine compound having a trihalomethyl group, peroxide, azo-type polymerization initiator, azide compound and quinonediazide. Among these, onium salt is preferred because of its high sensitivity. The onium salt which can be suitably used as the radical polymerization initiator in the present invention is described below. Preferred examples of the onium salt include iodonium salt, diazonium salt and sulfonium salt. These onium salts function as an initiator of radical polymerization but not as an acid generator. The onium salt for use in the present invention is more preferably an onium salt represented by the following formula (I), (II) or (III):

Formula (I):

$$AR^{11}—I^+—AR^{12} \qquad Z^{11-}$$

Formula (II):

$$AR^{21}—N^+\equiv N \qquad Z^{21-}$$

Formula (III):

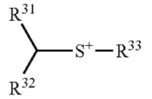

$Z^{31-}$

In formula (I), $Ar^{11}$ and $Ar^{12}$ each independently represents an aryl group having 20 or less carbon atoms, which may have a substituent. In the case where the aryl group has a substituent, preferred examples of the substituent include a halogen atom, a nitro group, an alkyl group having 12 or less carbon atoms, an alkoxy group having 12 or less carbon atoms, and an aryloxy group having 12 or less carbon atoms. $Z^{11-}$ represents a counter ion selected from the group consisting of halide ion, perchlorate ion, tetrafluoroborate ion, hexafluorophosphate ion, carboxylate ion and sulfonate ion, preferably perchlorate ion, hexafluorophosphate ion, carboxylate ion or arylsulfonate ion.

In formula (II), $Ar^{21}$ represents an aryl group having 20 or less carbon atoms, which may have a substituent. Preferred examples of the substituent include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, a dialkylamino group having 12 or less carbon atoms, an arylamino group having 12 or less carbon atoms, and a diarylamino group having 12 or less carbon atoms. $Z^{21-}$ represents a counter ion having the same meaning as $Z^{11-}$.

In formula (III), $R^{31}$, $R^{32}$ and $R^{33}$ may be the same or different and each represents a hydrocarbon group having 20 or less carbon atoms, which may have a substituent. Preferred examples of the substituent include a halogen atom, a nitro group, an alkyl group having 12 or less carbon atoms, an alkoxy group having 12 or less carbon atoms, and an aryloxy group having 12 or less carbon atoms. $z^{31-}$ represents a counter ion having the same meaning as $Z^{11-}$.

Specific examples of the onium salt which can be suitably used as the radical generator in the present invention include those described in JP-A-2001-133969, JP-A-2001-34374 and JP-A-2002-148790. Specific examples of the onium salt represented by formula (I) ([OI-1] to [OI-10], the onium salt represented by formula (II) ([ON-1] to [ON-5]) and the onium salt represented by formula (III) ([OS-1] to [OS-10]), which can be suitably used in the present invention, are set forth below, however, the present invention is not limited thereto.

[OI-1]

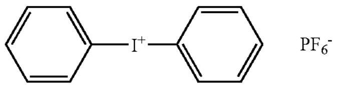

[OI-2]

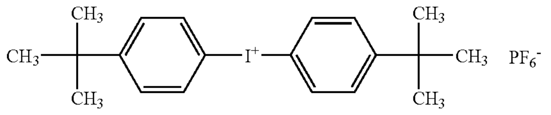

[OI-3]

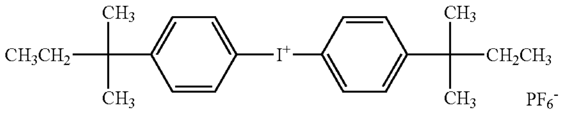

[OI-4]

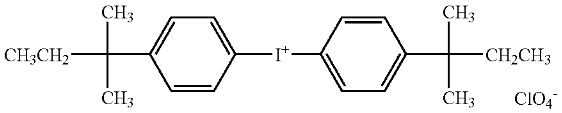

[OI-5]

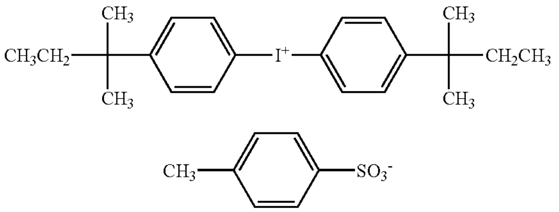

[OI-6]

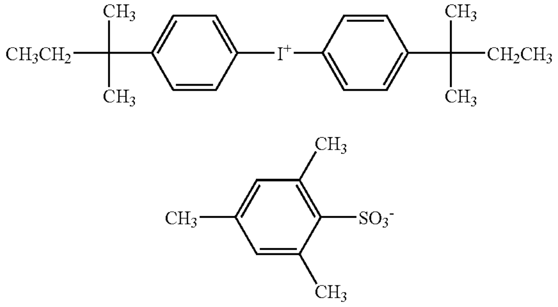

[OI-7]

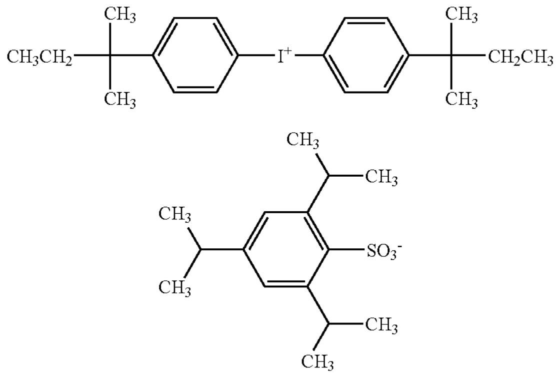

[OI-8]

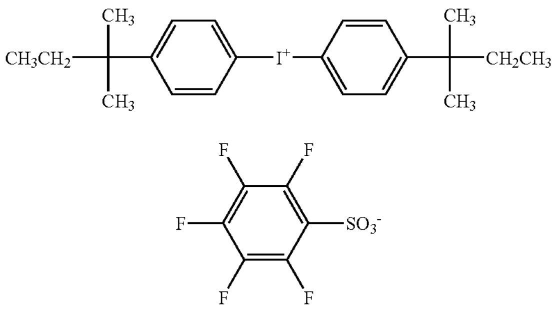

[OI-9]

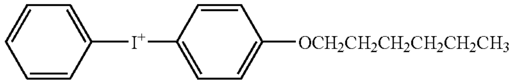

[OI-10]

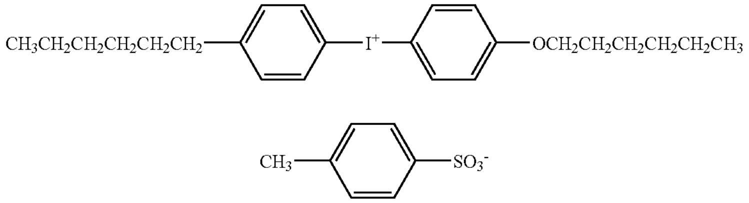

-continued
[ON-1]
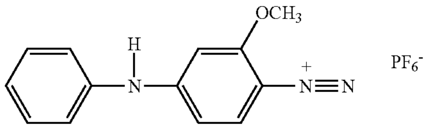
[ON-2]
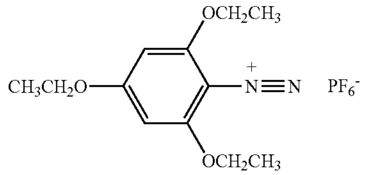
[ON-3]
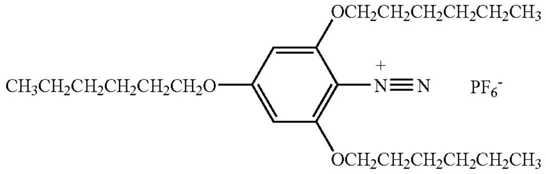
[ON-4]
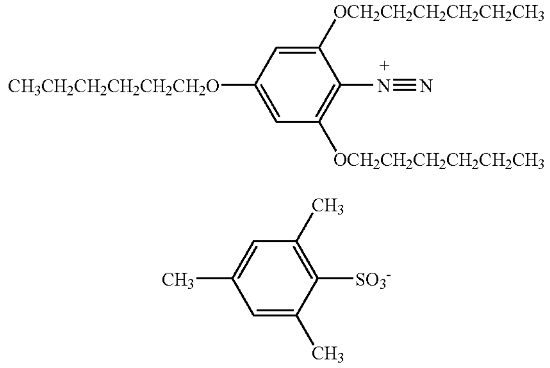
[ON-5]
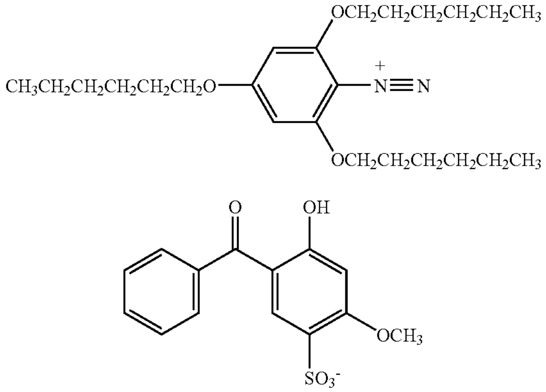
[OS-1]
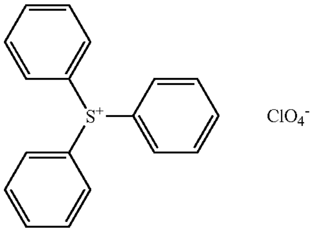
[OS-2]
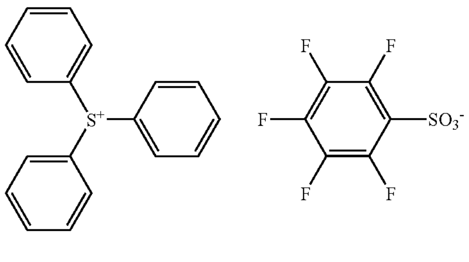
[OS-3]
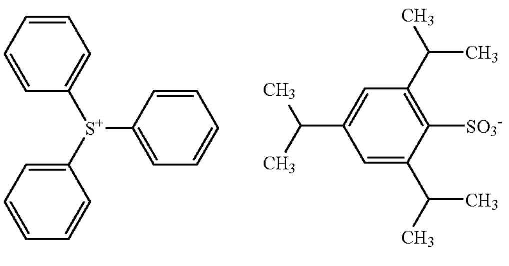

-continued

[OS-4]

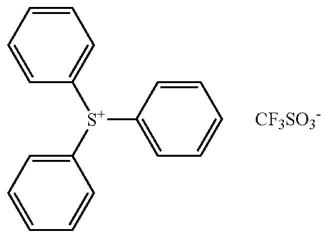

[OS-5]

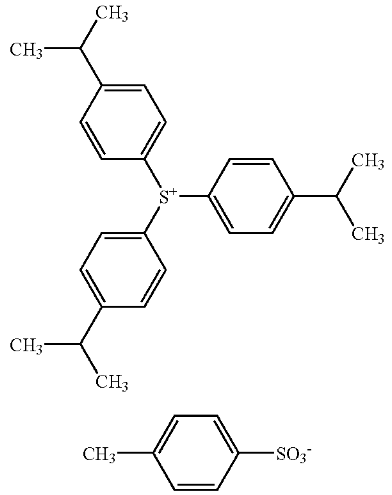

[OS-6]

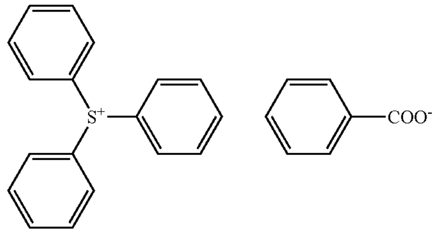

[OS-7]

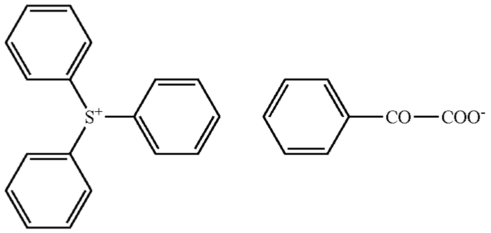

[OS-8]

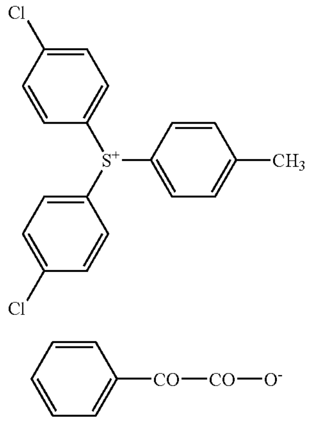

[OS-9]

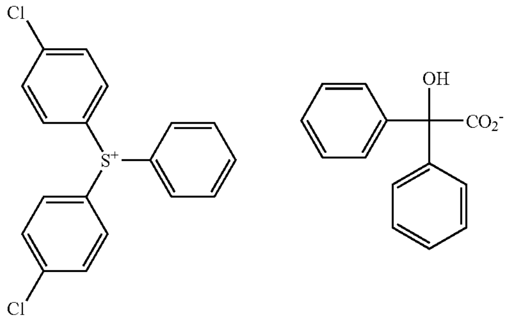

[OS-10]

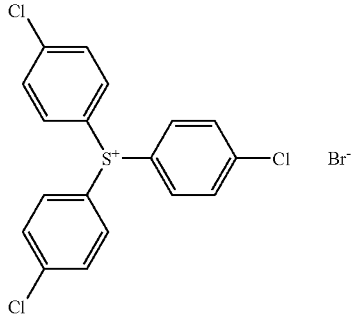

The radical generator for use in the present invention preferably has an absorption maximum wavelength of 400 nm or less, more preferably 360 nm or less, and most preferably 300 nm or less. By having the absorption wavelength in such an ultraviolet region, the lithographic printing plate precursor can be handled under white light.

This polymerization initiator can be added in a ratio of 0.1 to 50 mass %, preferably from 0.5 to 30 mass %, more preferably from 1 to 20 mass %, to the entire solid content constituting the image-recording layer.

These polymerization initiators may be used individually or in combination of two or more thereof. The polymerization initiator may be added also to a layer provided separately from the image-recording layer.

((C) Polymerizable Compound)

The polymerizable compound for use in the present invention is an addition-polymerizable compound having at least one ethylenic unsaturated double bond and is selected from compounds having at least one, preferably two or more, ethylenic unsaturated terminal bond(s). Such compounds are widely known in this industrial field and these known compounds can be used in the present invention without any particular limitation. These compounds have a chemical form such as monomer, prepolymer (that is, dimer, trimer or oligomer) or a mixture or copolymer thereof. Examples of the monomer and its copolymer include unsaturated carboxylic acids (e.g., acrylic acid, methacrylic acid, itaconic acid, crotonic acid, isocrotonic acid, maleic acid), and esters and amides thereof. Among these, preferred are esters of an unsaturated carboxylic acid with an aliphatic polyhydric alcohol compound, and amides of an unsaturated carboxylic acid with an aliphatic polyvalent amine compound. Also, addition reaction products of an unsaturated carboxylic acid ester or amide having a nucleophilic substituent such as hydroxyl group, amino group or mercapto group with a monofunctional or polyfunctional isocyanate or epoxy, and dehydrating condensation reaction products with a monofunctional or polyfunctional carboxylic acid may be suitably used. Furthermore, addition reaction products of an unsaturated carboxylic acid ester or amide having an electrophilic substituent such as isocyanate group or epoxy group with a monofunctional or polyfunctional alcohol, amine or thiol, and displacement reaction products of an unsaturated carboxylic acid ester or amide having a splitting-off substituent such as halogen group or tosyloxy group with a monofunctional or polyfunctional alcohol, amine or thiol may also be suitably used. These compounds but where the unsaturated carboxylic acid is replaced by an unsaturated phosphonic acid, styrene, vinyl ether or the like, may also be used.

Specific examples of the ester monomer of an aliphatic polyhydric alcohol compound with an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri-(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexa-acrylate, sorbitol triacrylate, sorbitol tetraacrylate, sorbitol pentaacrylate, sorbitol hexaacrylate, tri-(acryloyloxyethyl)isocyanurate and polyester acrylate oligomer; methacrylic acid esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, penta-erythritol-tetramethacrylate, dipentaerythritol dimeth-acrylate, dipentaerythritol hexamethacrylate, sorbitol trimethacrylate, sorbitol tetramethacrylate, bis[p-(3-methacryloxy-2-hydroxypropoxy)phenyl]dimethylmethane and bis[p-(methacryloxyethoxy)phenyl]dimethylmethane; itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonic acid esters such as ethylene glycol dicrotonate, tetramethylene glycol dicrotonate, pentaerythritol dicrotonate and sorbitol tetradicrotonate; isocrotonic acid esters such as ethylene glycol diisocrotonate, pentaerythritol diisocrotonate and sorbitol tetraisocrotonate; and maleic acid esters such as ethylene glycol dimaleate, triethylene glycol dimaleate, pentaerythritol dimaleate and sorbitol tetramaleate.

Other examples of the ester include aliphatic alcohol-base esters described in JP-B-46-27926, JP-B-51-47334 and JP-A-57-196231, those having an aromatic skeleton described in JP-A-59-5240, JP-A-59-5241 and JP-A-2-226149, and those containing an amino group described in JP-A-1-165613. These ester monomers may also be used as a mixture.

Specific examples of the amide monomer of an aliphatic polyvalent amine compound with an unsaturated carboxylic acid include methylenebisacrylamide, methylene-bis-methacrylamide, 1,6-hexamethylenebisacrylamide, 1,6-hexamethylenebismethacrylamide, diethylenetriaminetris-acrylamide, xylylenebisacrylamide and xylylenebis-methacrylamide. Other preferred examples of the amide-type monomer include those having a cyclohexylene structure described in JP-B-54-21726.

A urethane-base addition-polymerizable compound produced by using an addition reaction of isocyanate and a hydroxyl group is also suitably used and specific examples thereof include vinyl urethane compounds having two or more polymerizable vinyl groups within one molecule described in JP-B-48-41708, which are obtained by adding a vinyl monomer having a hydroxyl group represented by the following formula (IV) to a polyisocyanate compound having two or more isocyanate groups within one molecule:

$$CH_2{=}C(R_4)COOCH_2CH(R_5)OH \quad (IV)$$

(wherein $R_4$ and $R_5$ each represents H or $CH_3$)

Also, urethane acrylates described in JP-A-51-37193, JP-B-2-32293 and JP-B-2-16765, and urethane compounds having an ethylene oxide-type skeleton described in JP-B-58-49860, JP-B-56-17654, JP-B-62-39417 and JP-B-62-39418 are also suitably used. Furthermore, when addition-polymerizable compounds having an amino or sulfide structure within the molecule described in JP-A-63-277653, JP-A-63-260909 and JP-A-1-105238 are used, a photopolymerizable composition having very excellent photosensitivity can be obtained.

Other examples include polyfunctional acrylates and methacrylates such as polyester acrylates described in JP-A-48-64183, JP-B-49-43191 and JP-B-52-30490 and epoxy acrylates obtained by reacting an epoxy resin with a (meth) acrylic acid. In addition, specific unsaturated compounds described in JP-B-46-43946, JP-B-1-40337 and JP-B-1-40336, and vinyl phosphonic acid-base compounds described in JP-A-2-25493 may be used. In some cases, structures containing a perfluoroalkyl group described in JP-A-61-22048 are suitably used. Furthermore, those described as a photocurable monomer or oligomer in Nippon Secchaku Kyokaishi (Journal of Japan Adhesive Society), Vol. 20, No. 7, pp. 300-308 (1984) may also be used.

Details of the use method of these polymerizable compounds, such as structure of the compound, sole or combination use and amount added, can be freely selected in accordance with the designed performance of final lithographic printing plate precursor. For example, these are selected from the following standpoints.

In view of sensitivity, a structure having a large unsaturated group content per one molecule is preferred and in most cases, a bifunctional or greater functional compound is preferred. For increasing the strength of image area, namely, cured layer, a trifunctional or greater functional compound is preferred. A combination use of compounds differing in the functional number and in the polymerizable group (for example, an acrylic acid ester, a methacrylic acid ester, a styrene-base compound or a vinyl ether compound) is also an effective method for controlling both sensitivity and strength.

The selection and use method of the polymerizable compound are important factors also for the compatibility and dispersibility with other components (e.g., binder polymer, initiator, colorant) in the image-recording layer. For example, the compatibility may be improved in some cases by using a low purity compound or using two or more compounds in combination. Also, a specific structure may be selected for the purpose of improving the adhesive property to the support, overcoat layer which is described later, or the like.

In the image-recording layer, the polymerizable compound is preferably used in an amount of 5 to 80 mass %, more preferably from 25 to 75 mass. Also, these polymerizable compounds may be used individually or in combination of two or more thereof. As for the use method of the polymerizable compound, appropriate structure, blending and amount added can be freely selected by taking account of the degree of polymerization inhibition due to oxygen, resolution, fogging, change in refractive index, surface adhesive property and the like. Depending on the case, a layer construction and a coating method, such as undercoat and overcoat, can also be employed.

(Binder Polymer)

In the present invention, a binder polymer may be used for the purpose of enhancing the film properties or on-press developability of the image-recording layer. Conventionally known binder polymers can be used without limitation and a linear organic polymer having a film property is preferred. Examples of such a binder polymer include acrylic resin, polyvinyl acetal resin, polyurethane resin, polyurea resin, polyimide resin, polyamide resin, epoxy resin, methacrylic resin, polyimide resin, polyamide resin, epoxy resin, methacrylic resin, polystyrene-base resin, novolak-type phenol-base resin, polyester resin, synthetic rubber and natural rubber.

The binder polymer preferably has crosslinking property so as to enhance the film strength in the image area. The crosslinking property may be imparted to the binder polymer by introducing a crosslinkable functional group such as ethylenic unsaturated bond into the main or side chain of a polymer. The crosslinkable functional group may be introduced by ether copolymerization or polymer reaction.

Examples of the polymer having an ethylenic unsaturated bond in the main chain of the molecule include poly-1,4-butadiene and poly-1,4-isoprene.

Examples of the polymer having an ethylenic unsaturated bond in the side chain of the molecule include polymers which are a polymer of acrylic or methacrylic acid ester or amide and in which at least a part of the ester or amide residue (R in —COOR or CONHR) has an ethylenic unsaturated bond.

Examples of the residue (R in the above) having an ethylenic unsaturated bond include $-(CH_2)_nCR^1{=}CR^2R^3$, $-(CH_2O)_nCH_2CR^1{=}CR^2R^3$, $-(CH_2CH_2O)_nCH_2CR^1{=}CR^2R^3$, $-(CH_2)_nNH-CO-O-CH_2CR^1{=}CR^2R^3$, $-(CH_2)_n-O-CO-CR^1{=}CR^2R^3$ and $(CH_2CH_2O)_2-X$ (wherein $R^1$ to $R^3$ each represents a hydrogen atom, a halogen atom or an alkyl, aryl, alkoxy or aryloxy group having from 1 to 20 carbon atoms, $R^1$ and $R^2$ or $R^2$ and $R^3$ may combine with each other to form a ring, n represents an integer of 1 to 10, and X represents a dicyclopentadienyl residue).

Specific examples of the ester residue include $-CH_2CH{=}CH_2$, $-CH_2CH_2O-CH_2CH{=}CH_2$, $-CH_2C(CH_3){=}CH_2$, $-CH_2CH{=}CH-C_6H_5$, $-CH_2CH_2OCOCH{=}CH-C_6H_5$, $-CH_2CH_2OCOC(CH_3){=}CH_2$, $-CH_2CH_2OCOCH{=}CH_2$, $-CH_2CH_2-NHCOO-CH_2CH{=}CH_2$ and $CH_2CH_2O-X$ (wherein X represents a dicyclopentadienyl residue).

Specific examples of the amide residue include $-CH_2CH{=}CH_2$, $-CH_2CH_2-Y$ (wherein Y represents a cyclohexene residue) and $-CH_2CH_2-OCO-CH{=}CH_2$.

In the binder polymer having crosslinking property, for example, a free radical (a polymerization initiating radical or a radical grown in the process of polymerization of a polymerizable compound) is added to the crosslinkable functional group to cause addition-polymerization between polymers directly or through a polymerization chain of the polymerizable compound, as a result, crosslinking is formed between polymer molecules and thereby curing is effected. Alternately, an atom (for example, a hydrogen atom on the carbon atom adjacent to the functional crosslinkable group) in the polymer is withdrawn by a free radical to produce a polymer radical and the polymer radicals combine with each other to form crosslinking between polymer molecules, thereby effecting curing.

The content of the crosslinkable group (content of radical-polymerizable unsaturated double bond determined by iodine titration) in the binder polymer is preferably from 0.1 to 10.0 mmol, more preferably from 1.0 to 7.0 mmol, most preferably from 2.0 to 5.5 mmol, per g of the binder polymer. Within this range, good sensitivity and good storage stability can be obtained.

From the standpoint of enhancing the on-press developability of the unexposed area of the image-recording layer, the binder polymer preferably has high solubility or dispersibility in the ink and/or fountain solution.

In order to enhance the solubility or dispersibility in the ink, the binder polymer is preferably lipophilic and in order to enhance the solubility or dispersibility in the fountain solution, the binder polymer is preferably hydrophilic. Therefore, a combination use of a lipophilic binder polymer and a hydrophilic binder polymer is also effective in the present invention.

Incidentally, the binder polymer preferably contains no acidic group, because an acidic group having an acid dissociation constant (pKa) of less than 7, for example, a functional group such as $-COOH$, $-SO_3H$, $-OSO_3H$, $-PO_3H_2$ and $-OPO_3H_2$, sometimes adsorbs to the support and inhibits the on-press development.

Examples of the hydrophilic binder polymer which can be suitably used include those having a hydrophilic group such as hydroxy group, hydroxyethyl group, polyoxyethyl group, hydroxypropyl group, polyoxypropyl group, amino group, aminoethyl group, aminopropyl group, ammonium group and amido group.

Specific examples thereof include gum arabic, casein, gelatin, starch derivatives, carboxymethyl cellulose and sodium salt thereof, cellulose acetate, sodium alginate, vinyl acetate-maleic acid copolymers, styrene-maleic acid copolymers, polyacrylic acids and salts thereof, polymethacrylic acids and salts thereof, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetates having a hydrolysis degree of 60 mass % or more, preferably 80 mass % or more, polyvinyl formal, polyvinyl butyral, polyvinylpyrrolidone, homopolymers and copolymers of acrylamide, homopolymers and copolymers of methacrylamide, homopolymers and copolymers of N-methylolacrylamide, polyvinylpyrrolidone, alcohol-soluble nylons, and polyethers of 2,2-bis-(4-hydroxyphenyl)-propane with epichlorohydrin.

The weight average molecular weight of the binder polymer is preferably 5,000 or more, more preferably from 10,000 to 300,000. The number average molecular weight is preferably 1,000 or more, more preferably from 2,000 to 250,000. The polydispersion degree (weight average molecular weight/number average molecular weight) is preferably from 1.1 to 10.

The binder polymer may be a random polymer, a block polymer, a graft polymer or the like but is preferably a random polymer.

The binder polymer for use in the present invention can be synthesized by a conventionally known method. The binder polymer having a crosslinkable group in the side chain can be easily synthesized by radical polymerization or polymer reaction. The radical polymerization initiator used in the radical polymerization may be a known compound such as azo-type initiator or peroxide initiator. Examples of the solvent used in the synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide and water. These solvents are used individually or in combination of two or more thereof.

The binder polymers may be used individually or in combination of two or more thereof.

The binder polymer content is from 10 to 90 mass %, preferably from 20 to 80 mass %, more preferably from 30 to 70 mass %, based on the entire solid content of the image-recording layer. Within this range, good strength of image area and good image-forming property can be obtained.

The polymerizable compound and the binder polymer are preferably used in amounts of giving a mass ratio of 1/9 to 7/3.

The method which can be used in the present invention for incorporating the above-described constituent components of the image-recording layer and other constituent components described later into the image-recording layer includes several embodiments. One embodiment is a molecule dispersion-type image-recording layer described, for example, in JP-A-2002-287334, which is formed by dissolving those constituent components in an appropriate solvent and coating the obtained solution. Another embodiment is a microcapsule-type image-recording layer described, for example, in JP-A-2001-277740 and JP-A-2001-277742, where all or a part of those constituent components are enclosed in a microcapsule and the microcapsules are incorporated into the image-recording layer. In the microcapsule-type image-recording layer, those constituent components may be incorporated also outside the microcapsule. In a preferred embodiment of the microcapsule-type image-recording layer, hydrophobic constituent components are enclosed in a microcapsule and hydrophilic constituent components are incorporated outside the microcapsule. In order to obtain more excellent on-press developability, the image-recording layer is preferably a microcapsule-type image-recording layer.

For the encapsulation of those constituent components of the image-recording layer, conventionally known methods can be used. Examples of the method for producing a microcapsule include a method using coacervation described in U.S. Pat. Nos. 2,800,457 and 2,800,458, a method using interfacial polymerization described in U.S. Pat. No. 3,287,154, JP-B-38-19574 and JP-B-42-446, a method using polymer precipitation described in U.S. Pat. Nos. 3,418,250 and 3,660,304, a method using an isocyanate polyol wall material described in U.S. Pat. No. 3,796,669, a method using an isocyanate wall material described in U.S. Pat. No. 3,914,511, a method using a urea-formaldehyde or urea-formaldehyde-resorcinol wall material described in U.S. Pat. Nos. 4,001,140, 4,087,376 and 4,089,802, a method using a wall material such as melamine-formaldehyde resin or hydroxy cellulose described in U.S. Pat. No. 4,025,445, an in situ method using monomer polymerization described in JP-B-36-9163 and JP-A-51-9079, a spray drying method described in British Patent 930,422 and U.S. Pat. No. 3,111,407, and an electrolytic dispersion cooling method described in British Patents 952,807 and 967,074. However, the present invention is not limited thereto.

The wall of the microcapsule for use in the present invention preferably has a three-dimensionally crosslinked structure and has a property of swelling by a solvent. From this standpoint, the material for the microcapsule wall is preferably polyurea, polyurethane, polyester, polycarbonate, polyamide or a mixture thereof, more preferably polyurea or polyurethane. Also, the above-described compound having a crosslinkable functional group such as ethylenic unsaturated bond, which can be introduced into the binder polymer, may be introduced into the microcapsule wall.

The average particle size of the microcapsule is preferably from 0.01 to 3.0 μm, more preferably from 0.05 to 2.0 μm, still more preferably from 0.10 to 1.0 μm. Within this range, good resolution and good aging stability can be obtained.

(Other Additives)

The image-recording layer for use in the present invention may contain additives other than the above-described components, such as surfactant, colorant, printing-out agent, polymerization inhibitor, higher fatty acid derivative, plasticizer, inorganic fine particle and low molecule hydrophilic compound. These additives may be added in the molecular dispersion state to the image-recroding layer but, if desired, may be enclosed together with the polymerizable compound in a microcapsule.

<Surfactant>

In the present invention, a surfactant is preferably used in the image-recording layer so as to accelerate the on-press development at the initiation of printing and enhance the coated surface state. The surfactant includes a nonionic surfactant, an anionic surfactant, a cationic surfactant, an amphoteric surfactant, a fluorine-containing surfactant and the like. The surfactants may be used individually or in combination of two or more thereof.

The nonionic surfactant for use in the present invention is not particularly limited and a conventionally known nonionic surfactant can be used. Examples thereof include polyoxyethylene alkyl ethers, polyoxyethylene alkylphenyl ethers, polyoxyethylene polystyrylphenyl ethers, polyoxyethylene polyoxypropylene alkyl ethers, glycerin fatty acid partial esters, sorbitan fatty acid partial esters, pentaerythritol fatty acid partial esters, propylene glycol monofatty acid esters, sucrose fatty acid partial esters, polyoxyethylene sorbitan fatty acid partial esters, polyoxyethylene sorbitol fatty acid partial esters, polyethylene glycol fatty acid esters, polyglycerin fatty acid partial esters, polyoxyethylene castor oils, polyoxyethylene glycerin fatty acid partial esters, fatty acid diethanolamides, N,N-bis-2-hydroxyalkylamines, polyoxyethylene alkylamines, triethanolamine fatty acid esters, trialkylamine oxides, polyethylene glycol, and copolymers of polyethylene glycol and polypropylene glycol.

The anionic surfactant for use in the present invention is not particularly limited and a conventionally known anionic surfactant can be used. Examples thereof include fatty acid salts, abietates, hydroxyalkane-sulfonates, alkanesulfonates, dialkylsulfosuccinates, linear alkylbenzenesulfonates, branched alkylbenzene-sulfonates, alkylnaphthalene-sulfonates, alkylphenoxy-polyoxyethylenepropylsulfonates, polyoxyethylenealkyl-sulfophenyl ether salts, N-methyl-N-oleyltaurine sodium salts, monoamide disodium N-alkylsulfosuccinates, petroleum sulfonates, sulfated beef tallow oils, sulfuric ester salts of fatty acid alkyl ester, alkylsulfuric ester salts, polyoxyethylene alkyl ether sulfuric ester salts, fatty acid monoglyceride sulfuric ester salts, polyoxyethylene alkylphenylether sulfuric ester salts, polyoxyethylene styrylphenylether sulfuric ester salts, alkyl phosphoric ester salts, polyoxyethylene alkyl ether phosphoric ester salts, polyoxyethylene alkylphenylether phosphoric ester salts, partially saponified products of styrene/maleic anhydride copolymer, partially saponified products of olefin/maleic anhydride copolymer, and naphthalenesulfonate formalin condensates.

The cationic surfactant for use in the present invention is not particularly limited and a conventionally known cationic surfactant can be used. Examples thereof include alkylamine salts, quaternary ammonium salts, polyoxyethylenealkylamine salts, and polyethylene polyamine derivatives.

The amphoteric surfactant for use in the present invention is not particularly limited and a conventionally known amphoteric surfactant can be used. Examples thereof include carboxybetaines, aminocarboxylic acids, sulfobetaines, aminosulfuric esters and imidazolines.

The term "polyoxyethylene" in the above-described surfactants can be instead read as "polyoxyalkylene" such as polyoxymethylene, polyoxypropylene and polyoxybutylene, and these surfactants can also be used in the present invention.

The surfactant is more preferably a fluorine-containing surfactant containing a perfluoroalkyl group within the molecule. This fluorine-containing surfactant includes an anionic type such as perfluoroalkylcarboxylate, perfluoroalkylsulfonate and perfluoroalkylphosphoric ester; an amphoteric type such as perfluoroalkylbetaine; a cationic type such as perfluoroalkyltrimethylammonium salt; and a nonionic type such as perfluoroalkylamine oxide, perfluoroalkyl ethylene oxide adduct, oligomer containing a perfluoroalkyl group and a hydrophilic group, oligomer containing a perfluoroalkyl group and a lipophilic group, oligomer containing a perfluoroalkyl group, a hydrophilic group and a lipophilic group, and urethane containing a perfluoroalkyl group and a lipophilic group. In addition, fluorine-containing surfactants described in JP-A-62-170950, JP-A-62-226143 and JP-A-60-168144 may also be suitably used.

The surfactants can be used individually or in combination of two or more thereof.

The surfactant is preferably contained in an amount of 0.001 to 10 mass %, more preferably from 0.01 to 5 mass %, based on the entire solid content of the image-recording layer.

<Colorant>

In the image-recording layer of the present invention, a dye having large absorption in the visible light region can be used as a colorant of the image. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industry Co., Ltd.), Victoria Pure Blue, Crystal Violet (CI42555), Methyl Violet (CI42535), Ethyl Violet, Rhodamine B (CI145170B), Malachite Green (CI42000), Methylene Blue (CI52015), and dyes described in JP-A-62-293247. Also, pigments such as phthalocyanine-base pigment, azo-base pigment, carbon black and titanium oxide may be suitably used.

The colorant is preferably added so as to provide clear distinction between the image area and the non-image area after the image formation. The amount of the colorant added is from 0.01 to 10 mass % based on the entire solid content of the image-recording layer.

<Printing-Out Agent>

In the image-recording layer of the present invention, a compound of undergoing change in the color under the action of an acid or a radical can be added so as to produce a print-out image. As such a compound, various dyes such as diphenylmethane-base dye, triphenylmethane-base dye, thiazine-base dye, oxazine-base dye, xanthene-base dye, anthraquinone-base dye, iminoquinone-base dye and azomethine-base dye are effective.

Specific examples thereof include dyes such as Brilliant Green, Ethyl Violet, Methyl Green, Crystal Violet, Basic Fuchsine, Methyl Violet 2B, Quinaldine Red, Rose Bengale, Metanil Yellow, Thymolsulfophthalein, Xylenol Blue, Methyl Orange, Paramethyl Red, Congo Red, Benzopurpurine 4B, α-Naphthyl Red, Nile Blue 2B, Nile Blue A, Methyl Violet, Malachite Green, Parafuchsine, Victoria Pure Blue BOH [produced by Hodogaya Chemical Co., Ltd.], Oil Blue #603 [produced by Orient Chemical Industry Co., Ltd.], Oil Pink #312 [produced by Orient Chemical Industry Co., Ltd.], Oil Red SB [produced by Orient Chemical Industry Co., Ltd.], Oil Scarlet #308 [produced by Orient Chemical Industry Co., Ltd.], Oil Red OG [produced by Orient Chemical Industry Co., Ltd.], Oil Red RR [produced by Orient Chemical Industry Co., Ltd.], Oil Green #502 [produced by Orient Chemical Industry Co., Ltd.], Spiron Red BEH Special [produced by Hodogaya Chemical Co., Ltd.], m-Cresol Purple, Cresol Red, Rhodamine B, Rhodamine 6G, Sulforhodamine B, Auramine, 4-p-diethylaminophenyliminonaphthoquinone, 2-carboxyanilino-4-p-diethylaminophenyliminonaphthoquinone, 2-carbostearyl-amino-4-p-N,N-bis(hydroxyethyl)aminophenyliminonaphtho-quinone, 1-phenyl-3-methyl-4-p-diethylaminophenylimino-5-pyrazolone and 1-β-naphthyl-4-p-diethylaminophenylimino-5-pyrazolone, and leuco dyes such as p,p',p"-hexamethyltriaminotriphenyl methane (Leuco Crystal Violet) and Pergascript Blue SRB (produced by Ciba Geigy).

Other suitable examples include leuco dyes known as a material for heat-sensitive or pressure-sensitive paper. Specific examples thereof include Crystal Violet Lactone, Malachite Green Lactone, Benzoyl Leuco Methylene Blue, 2-(N-phenyl-N-methylamino)-6-(N-p-tolyl-N-ethyl) aminofluorane, 2-anilino-3-methyl-6-(N-ethyl-p-toluidino) fluorane, 3,6-dimethoxyfluorane, 3-(N,N-diethylamino)-5-methyl-7-(N,N-dibenzylamino)-fluorane, 3-(N-cyclohexyl-N-methylamino)-6-methyl-7-anilinofluorane, 3-(N,N-diethylamino)-6-methyl-7-anilinofluorane, 3-(N,N-diethylamino)-6-methyl-7-xylidino-fluorane, 3-(N,N-diethylamino)-6-methyl-7-chlorofluorane, 3-(N,N-diethylamino)-6-methoxy-7-aminofluorane, 3-(N,N-diethylamino)-7-(4-chloroanilino)fluorane, 3-(N,N-diethylamino)-7-chlorofluorane, 3-(N,N-diethylamino)-7-benzylaminofluorane, 3-(N,N-diethylamino)-7,8-benzofluorane, 3-(N,N-dibutylamino)-6-methyl-7-anilinofluorane, 3-(N,N-dibutylamino)-6-methyl-7-xylidinofluorane, 3-piperidino-6-methyl-7-anilinofluorane, 3-pyrrolidino-6-methyl-7-anilino-fluorane, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-phthalide and 3-(4-diethylaminophenyl)-3-(1-ethyl-2-methylindol-3-yl) phthalide.

The dye of undergoing change in the color under the action of an acid or a radical is preferably added in a ratio of 0.01 to 10 mass % to the entire solid content of the image-recording layer.

<Thermopolymerization Inhibitor>

In the image-recording layer of the present invention, a small amount of a thermopolymerization inhibitor is preferably added so as to prevent the polymerizable compound (C) from undergoing unnecessary thermopolymerization during the preparation or storage of the image-recording layer.

Suitable examples of the thermopolymerization inhibitor include hydroquinone, p-methoxyphenol, di-tert-butyl-p-cresol, pyrogallol, tert-butyl catechol, benzoquinone, 4,4'-thiobis(3-methyl-6-tert-butylphenol), 2,2'-methylenebis(4-methyl-6-tert-butylphenol) and N-nitroso-N-phenylhydroxylamine aluminum salt.

The thermopolymerization inhibitor is preferably contained in an amount of about 0.01 to about 5 mass % based on the entire solid content of the image-recording layer.

<Higher Fatty Acid Derivative, etc.>

In the image-recording layer of the present invention, a higher fatty acid derivative such as behenic acid or behenic acid amide may be added to localize on the surface of the image-recording layer during drying after coating so as to prevent polymerization inhibition by oxygen. The amount of the higher fatty acid derivative added is preferably from about 0.1 to about 10 mass % based on the entire solid content of the image-recording layer.

<Plasticizer>

The image-recording layer of the present invention may contain a plasticizer for enhancing the on-press developability.

Suitable examples of the plasticizer include phthalic acid esters such as dimethyl phthalate, diethyl phthalate, dibutyl phthalate, diisobutylphthalate, diocyl phthalate, octyl capryl phthalate, dicyclohexyl phthalate, ditridecyl phthalate, butyl benzyl phthalate, diisodecyl phthalate and diallyl phthalate; glycol esters such as dimethyl glycol phthalate, ethyl phthalylethyl glycolate, methyl phthalylethyl glycolate, butyl phthalylbutyl glycolate and triethylene glycol dicaprylic acid ester; phosphoric acid esters such as tricresyl phosphate and triphenyl phosphate; aliphatic dibasic acid esters such as diisobutyl adipate, dioctyl adipate, dimethyl sebacate, dibutyl sebacate, dioctyl azelate and dibutyl maleate; polyglycidyl methacrylate, triethyl citrate, glycerin triacetyl ester and butyl laurate.

The plasticizer is preferably contained in a ratio of about 30 mass % or less to the entire solid content of the image-recording layer.

<Inorganic Fine Particle>

The image-recording layer of the present invention may contain an inorganic fine particle so as to increase the interface adhesion by the surface roughening, improve the cured film strength in the image area and enhance the on-press developability of the non-image area.

Suitable examples of the inorganic fine particle include silica, alumina, magnesium oxide, titanium oxide, magnesium carbonate, calcium alginate and a mixture thereof.

The average particle size of the inorganic fine particle is preferably from 5 nm to 10 μm, more preferably from 0.5 to 3 μm. Within this range, the inorganic particles are stably dispersed in the image-recording layer, so that the image-recording layer can maintain sufficiently high film strength and the non-image area formed can have excellent hydrophilicity and be insusceptible to scumming at printing.

Such an inorganic fine particle is easily available on the market as a colloidal silica dispersion or the like.

The inorganic fine particle content is preferably 20 mass % or less, more preferably 10 mass % or less, based on the entire solid content of the image-recording layer.

<Low-Molecular Hydrophilic Compound>

The image-recording layer of the present invention may contain a hydrophilic low molecular compound so as to enhance the on-press developability. Examples of the hydrophilic low molecular compound include, as the water-soluble organic compound, glycols and ether or ester derivatives thereof, such as ethylene glycol, diethylene glycol, triethylene glycol, propylene glycol, dipropylene glycol and tripropylene glycol, polyhydroxys such as glycerin and pentaerythritol, organic amines and salts thereof, such as triethanolamine, diethanolamine and monoethanolamine, organic sulfonic acids and salts thereof, such as toluenesulfonic acid and benzenesulfonic acid, organic phosphonic acids and salts thereof, such as phenylphosphonic acid, and organic carboxylic acids and salts thereof, such as tartaric acid, oxalic acid, citric acid, malic acid, lactic acid, gluconic acid and amino acids.

[Formation of Image-Recording Layer]

The image-recording layer of the present invention is formed by dispersing or dissolving the above-described necessary components in a solvent to prepare a coating solution and coating the obtained coating solution. Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyl lactone, toluene and water, however, the present invention is not limited thereto. These solvents are used individually or in combination. The concentration of the solid contents in the coating solution is preferably from 1 to 50 mass %.

The image-recording layer of the present invention may also be formed by dispersing or dissolving the same or different components described above in the same or different solvents to prepare a plurality of coating solutions and repeating the coating and drying multiple times.

The amount (solid content) coated of the image-recording layer obtained on the support after the coating and drying varies depending on the use but, in general, is preferably from 0.3 to 3.0 g/$m^2$. Within this range, good sensitivity and good film properties of the image-recording layer can be obtained.

For the coating, various methods may be used and examples thereof include bar coater coating, rotary coating, spray coating, curtain coating, dip coating, air knife coating, blade coating and roll coating.

[Backcoat]

After the support is subjected to a surface treatment or formation of an undercoat layer, a backcoat may be provided on the back surface of the support, if desired.

Suitable examples of the backcoat include a coating layer comprising a metal oxide obtained by hydrolyzing and polycondensing an organic polymer compound described in JP-A-5-45885 or an organic or inorganic metal compound described in JP-A-6-35174. Among these, those using an alkoxy compound of silicon, such as $Si(OCH_3)_4$, $Si(OC_2H_5)_4$, $Si(OC_3H_7)_4$ and $Si(OC_4H_9)_4$, are preferred because the raw material is inexpensive and easily available.

[Protective Layer]

In the lithographic printing plate precursor of the present invention, a protective layer may be provided on the image-recording layer, if desired, so as to prevent generation of scratches or the like on the image-recording layer, block oxygen or prevent ablation at the exposure with a high-intensity laser.

In the present invention, the exposure is usually performed in air and the protective layer prevents low molecular compounds such as oxygen and basic substance present in air, which inhibit an image-forming reaction generated upon exposure in the image-recording layer, from mixing into the image-recording layer and thereby prevents the inhibition of image-forming reaction at the exposure in air. Accordingly, the property required of the protective layer is low permeability to low molecular compounds such as oxygen. Furthermore, the protective layer preferably has good transmittance of light used for exposure, excellent adhesion to the image-recording layer, and easy removability during on-press development after exposure. Various studies have been heretofore made on the protective layer having these properties and such protective layers are described in detail, for example, in U.S. Pat. No. 3,458,311 and JP-A-55-49729.

Examples of the material used for the protective layer include a water-soluble polymer compound having relatively excellent crystallinity. Specific examples thereof include water-soluble polymers such as polyvinyl alcohol, polyvinylpyrrolidone, acidic celluloses, gelatin, gum arabi and polyacrylic acid. In particular, when polyvinyl alcohol (PVA) is used as the main component, most excellent results are obtained with respect to basic properties such as oxygen-blocking property and removability by development. As long as the polyvinyl alcohol contains an unsubstituted vinyl alcohol unit for giving necessary oxygen-blocking property and water solubility to the protective layer, a part thereof may be partially replaced by an ester, an ether or an acetal or may have another copolymerization component.

Examples of the polyvinyl alcohol which can be suitably used include those having a hydrolysis degree of 71 to 100% and a molecular weight of 300 to 2,400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8 produced by Kuraray Co., Ltd.

The components (for example, selection of PVA and use of additives), coated amount and the like of the protective layer are appropriately selected by taking account of fogging, adhesion, scratch resistance and the like in addition to the oxygen-blocking property and removability by development. In general, as the PVA has a higher percentage of hydrolysis (namely, as the unsubstituted vinyl alcohol unit content in the protective layer is higher) or as the layer thickness is larger, the oxygen-blocking property is enhanced and this is preferred in view of sensitivity. Also, in order to prevent the generation of unnecessary polymerization reaction at the production or during storage, unnecessary fogging at the image exposure or thickening or the like of image line, an excessively high oxygen permeability is not preferred. Accordingly, the oxygen permeability A at 25° C. and 1 atm is preferably $0.2 \leqq A \leqq 20$ (cc/$m^2$·day).

The molecular weight of the (co)polymer which can used, such as polyvinyl alcohol (PVA), is from 2,000 to 10,000,000, preferably from 20,000 to 3,000,000.

As other components of the protective layer, glycerin, dipropylene glycol and the like may be added in an amount corresponding to several mass % based on the (co)polymer so as to impart flexibility. Also, an anionic surfactant such as sodium alkylsulfate and sodium alkylsulfonate; an amphoteric surfactant such as alkylaminocarboxylate and alkylaminodicarboxylate; or a nonionic surfactant such as polyoxyethylene alkylphenyl ether may be added in several mass % based on the (co)polymer.

The thickness of the protective layer is suitably from 0.1 to 5 μm, preferably from 0.2 to 2 μm.

The adhesion to the image area, scratch resistance and the like of the protective layer are also very important in view of handling of the lithographic printing plate precursor. More specifically, when a protective layer which is hydrophilic by containing a water-soluble polymer compound is stacked on the image-recording layer which is lipophilic, the protective layer is readily separated due to insufficient adhesive strength and in the separated portion, defects such as curing failure ascribable to polymerization inhibition by oxygen may be caused.

In order to solve this problem, various proposals have been made with an attempt to improve the adhesive property between the image-recording layer and the protective layer. For example, JP-A-49-70702 and Unexamined British Patent Publication No. 1,303,578 describe a technique of mixing from 20 to 60 mass % of an acrylic emulsion, a water-insoluble vinylpyrrolidone-vinyl acetate copolymer or the like in a hydrophilic polymer mainly comprising polyvinyl alcohol and stacking the obtained solution on the image-recording layer, whereby sufficiently high adhesive property can be obtained. In the present invention, these known techniques all can be used. The method for coating the protective layer is described in detail, for example, in U.S. Pat. No. 3,458,311 and JP-A-55-49729.

Furthermore, other functions may be imparted to the protective layer. For example, when a colorant (for example, water-soluble dye) excellent in the transmission of infrared ray used for exposure and capable of efficiently absorbing light at other wavelengths is added, the aptitude for safelight can be enhanced without causing decrease of sensitivity.

[Lithographic Printing Method]

In the lithographic printing method of the present invention, the above-described lithographic printing plate precursor of the present invention is imagewise exposed by an infrared laser.

The infrared laser for use in the present invention is not particularly limited, but suitable examples thereof include a solid or semiconductor laser of radiating an infrared ray at a wavelength of 760 to 1,200 nm. The output of the infrared laser is preferably 100 mW or more and in order to shorten the exposure time, a multi-beam laser device is preferably used.

The exposure time is preferably 20 μ seconds or less per one picture element. The amount of energy irradiated is preferably from 10 to 300 $mJ/cm^2$.

In the lithographic printing method of the present invention, after the lithographic printing plate precursor of the present invention is imagewise exposed with an infrared laser as described above, printing is performed by supplying an oily ink and an aqueous component without passing through any development processing step.

Specific examples of the method therefor include a method of exposing the lithographic printing plate precursor with an infrared laser, then loading it on a printing press without passing through a development processing step and performing printing, and a method of loading the lithographic printing plate precursor on a printing press, exposing it with an infrared laser on the printing press, and performing printing without passing through a development processing step.

When the lithographic printing plate precursor is imagewise exposed with an infrared laser and then printing is performed by supplying an aqueous component and an oily ink without passing through a development processing step such as wet development, the uncured image-recording layer in the unexposed area is dissolved or dispersed in the supplied aqueous component and/or oily ink and thereby removed and the hydrophilic support surface in this portion is revealed. On the other hand, in the exposed area, the image-recording layer cured by the exposure forms an oily ink-receiving part having a lipophilic surface.

As a result, the aqueous component adheres to the revealed hydrophilic surface and the oily ink adheres to the image-recording layer in the exposed region, thereby initiating the printing. Here, either the aqueous component or the oily ink may be first supplied to the plate surface, but the oily ink is preferably first supplied so as to prevent the aqueous component from being contaminated by the image-recording layer in the unexposed area. A fountain solution and a printing ink for normal lithographic printing are used as the aqueous component and oily ink, respectively.

In this way, the lithographic printing plate precursor is on-press developed on an off-set printing press and used for printing of a large number of sheets.

EXAMPLES

The present invention is described in greater detail below by referring to the Examples, however, the present invention should not be construed as being limited thereto.

1. Production of Lithographic Printing Plate Precursor (1) Preparation of Support A molten metal of JIS A1050 aluminum alloy containing 99.5 mass % or more of aluminum, 0.30 mass % of Fe, 0.10 mass % of Si, 0.02 mass % of Ti and 0.013 mass % of Cu with the balance being unavoidable impurities was subjected to a cleaning treatment and then cast. In the cleaning treatment, the molten metal was subjected to a degassing treatment for removing unnecessary gases such as hydrogen and further to a ceramic tube filter treatment. The casting was performed by the DC casting method. The solidified ingot having a plate thickness of 500 mm was scalped to 10 mm from the surface and subjected to a homogenization treatment at 550° C. for 10 hours so as to prevent the intermetallic compound from becoming coarse. Subsequently, the plate was hot-rolled at 400° C., subjected to intermediate annealing at 500° C. for 60 seconds in a continuous annealing furnace, and then cold-rolled to obtain an aluminum rolled plate having a thickness of 0.30 mm. By controlling the roughness of the rolling roller, the center line average surface roughness Ra after the cold rolling was controlled to 0.2 μm. Thereafter, the plate was applied with a tension leveler to improve the planeness. The obtained aluminum plate was surface-treated as follows.

The aluminum plate was first degreased with an aqueous 10 mass % sodium aluminate solution at 50° C. for 30 seconds to remove the rolling oil on the plate surface and then treated for neutralization and desmutting with an aqueous 30 mass % nitric acid solution at 50° C. for 30 seconds.

Subsequently, the aluminum plate was subjected to a surface-roughening treatment so as to obtain good adhesion between the image-recording layer and the support and at the same time to impart water receptivity to the non-image area. More specifically, while passing the aluminum plate web through an aqueous solution (liquid temperature: 45° C.) supplied to an indirect power feed cell and containing 1 mass % of nitric acid and 0.5 mass % of aluminum nitrate, the electrolysis was performed by using an alternating waveform having a duty ratio of 1.1 at a current density of 20 $A/dm^2$ to give a quantity of electricity of 240 $C/dm^2$ when the aluminum plate was serving as the anode, thereby effecting the electrochemical surface-roughening treatment.

Furthermore, the plate was etched with an aqueous 10 mass % sodium hydroxide solution at 35° C. for 30 seconds and then treated for neutralization and desmutting with an aqueous 30 mass % sulfuric acid solution at 50° C. for 30 seconds.

Thereafter, in order to improve the abrasion resistance, chemical resistance and water receptivity, the aluminum plate was subjected to an anodization treatment. More specifically, while passing the aluminum plate web through an aqueous 20 mass % sulfuric acid solution (liquid temperature: 35° C.) supplied to an indirect power feed cell, the electrolysis was performed by using a direct current at a current density of 14 $A/dm^2$ to form an anodic oxide film of 2.5 $g/m^2$, thereby preparing Support A.

Example 1

The thus-produced Aluminum Support A was subjected to a silicate treatment with an aqueous 1.0 mass % sodium No. 3 silicate solution at 30° C. for 60 seconds. The amount of Si element attached was 4.6 $mg/M^2$. The resulting support was washed with water to complete the support. The obtained support had a center line average roughness Ra of 0.28 μm.

On this silicate-treated support, Coating Solution (1) for Image-Recording Layer having a composition shown below was bar-coated and dried in an oven at 70° C. for 60 seconds to form an image-recording layer having a dry coated amount of 0.8 $g/m^2$, thereby obtaining a lithographic printing plate precursor.

Coating Solution (1) for Image-Recording Layer:

| | |
|---|---|
| Water | 100 g |
| Microcapsule (1) described below (as solid content) | 5 g |
| Polymerization initiator (OS-7 shown in the specification) | 0.5 g |
| Fluorine-Containing Surfactant (1) shown below | 0.2 g |
| Fluorine-Containing Surfactant (1): | |

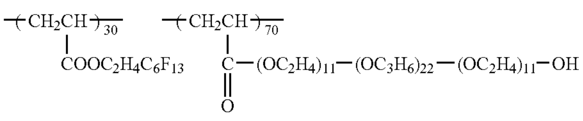

(Synthesis of Microcapsule (1))

As the oil phase component, 10 g of trimethylol-propane and xylene diisocyanate adduct (Takenate D-110N, produced by Mitsui Takeda Chemicals, Inc.), 3.15 g of pentaerythritol triacrylate (SR444, produced by Nippon Kayaku Co., Ltd.), 0.35 g of Infrared Absorbent (1) shown below, 1 g of 3-(N,N-diethylamino)-6-methyl-7-anilino-fluorane (ODB, produced by Yamamoto Chemicals, Inc.) and 0.1 g of Pionin A41C (produced by Takemoto Yushi Co., Ltd.) were dissolved in 17 g of ethyl acetate. As the aqueous phase component, 40 g of an aqueous 4 mass % PVA-205 solution was prepared. The oil phase component and the aqueous phase component were mixed and emulsified in a homogenizer at 12,000 rpm for 10 minutes. The resulting emulsified product was added to 25 g of distilled water, stirred at room temperature for 30 minutes and then stirred at 40° C. for 3 hours. The thus-obtained microcapsule solution was diluted with distilled water to have a solid content concentration of 20 mass %. The average particle size was 0.3 μm.

Infrared Absorbent (1):

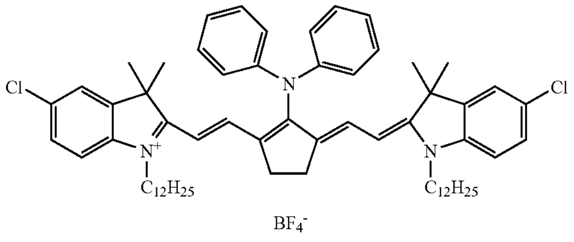

Example 2

On the aluminum support treated with silicate in the same manner as in Example 1, Coating Solution (2) for Image-Recording Layer having a composition shown below was bar-coated and dried in an oven at 100° C. for 60 seconds to form an image-recording layer having a dry coated amount of 1.0 $g/m^2$, thereby obtaining a lithographic printing plate precursor.

Coating Solution (2) for Image-Recording Layer

| | |
|---|---|
| Infrared Absorbent (2) shown below | 0.05 g |
| Polymerization initiator (OS-7 shown in the specification) | 0.2 g |
| Binder Polymer (1) shown below (average molecular weight: 80,000) | 0.5 g |
| Polymerizable compound Isocyanuric acid EO-modified triacrylate (NK Ester M-315, produced by Shin-Nakamura Chemical Co., Ltd.) | 1.0 g |
| Naphthalenesulfonate of Victoria Pure Blue | 0.02 g |
| Fluorine-Containing Surfactant (1) shown above | 0.1 g |
| Methyl ethyl ketone | 18.0 g |
| Infrared Absorbent (2): | |

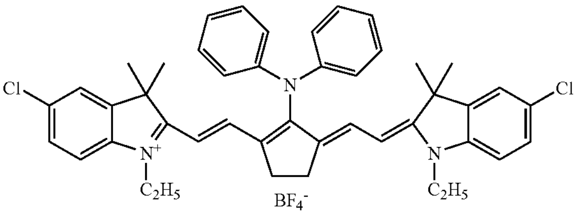

Binder Polymer (1):

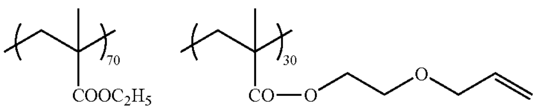

Example 3

Aluminum Support A prepared above was subjected to a silicate treatment with an aqueous 2.5 mass % sodium No. 3 silicate solution at 50° C. for 60 seconds. The amount of Si element attached was 8.2 $mg/M^2$. The resulting support was washed with water to complete the support. The obtained support had a center line average roughness Ra of 0.28 μm.

On this silicate-treated support, Coating Solution (2) for Image-Recording Layer was bar-coated and dried in an oven at 100° C. for 60 seconds to form an image-recording layer having a dry coated amount of 1.0 $g/m^2$, thereby obtaining a lithographic printing plate precursor.

Example 4

Aluminum Support A prepared above was subjected to a silicate treatment with an aqueous 1.0 mass % sodium No. 3 silicate solution at 28° C. for 12 seconds. The amount of Si element attached was 2.7 $mg/m^2$. The resulting support was washed with water to complete the support. The obtained support had a center line average roughness Ra of 0.28 μm.

On this silicate-treated support, Coating Solution (2) for Image-Recording Layer was bar-coated and dried in an oven at 100° C. for 60 seconds to form an image-recording layer having a dry coated amount of 1.0 $g/m^2$, thereby obtaining a lithographic printing plate precursor.

Comparative Example 1

A lithographic printing plate precursor was obtained by forming the image-recording layer thoroughly in the same manner as in Example 1 except for not performing the silicate treatment in Example 1.

Comparative Example 2

A lithographic printing plate precursor was obtained by forming the image-recording layer thoroughly in the same manner as in Example 2 except for not performing the silicate treatment in Example 2.

Comparative Example 3

Aluminum Support A prepared above was subjected to a silicate treatment with an aqueous 2.0 mass % sodium No. 3 silicate solution at 70° C. for 10 seconds. The amount of Si element attached was 12 mg/m$^2$. The resulting support was washed with water to complete the support. The obtained support had a center line average roughness Ra of 0.28 μm.

On this silicate-treated support, Coating Solution (1) for Image-Recording Layer was bar-coated and dried in an oven at 70° C. for 60 seconds in the same manner as in Example 1 to form an image-recording layer having a dry coated amount of 0.8 g/m$^2$, thereby obtaining a lithographic printing plate precursor.

passing through development processing, the resulting exposed lithographic printing plate precursor was loaded on a cylinder of a printing press SOR-M manufactured by Heidelberg. Using a fountain solution (EU-3 (etching solution, produced by Fuji Photo Film Co., Ltd.))/water/isopropyl alcohol=1/89/10 (by volume)) and TRNS-G(N) black ink (produced by Dai-Nippon Ink & Chemicals, Inc.), 100 sheets were printed by supplying the fountain solution and ink at a printing speed of 6,000 sheets per hour.

The number of printing sheets required until the removal of the image-recording layer in the unexposed area was completed on the printing press and the staining of the non-image area on the printed matter did not occur was counted and evaluated as the on-press developability. A smaller number of sheets reveals that the on-press development was more swiftly performed.

The printing was further continued. As the number of printed sheets was increased, the image-recording layer was gradually abraded to decrease the ink-receiving property, as a result, the ink density on the printed matter was decreased. The press life was evaluated by the number of printed sheets until the ink density (reflection density) was decreased by 0.1 than that at the initiation of printing.

The results are shown in Table 1.

TABLE 1

EXAMPLES 1 TO 4 AND COMPARATIVE EXAMPLES 1 TO 4

| | Alkali Metal Silicate Treatment Conditions | | | | Kind of Coating Solution for Image-Recording Layer | On-Press Developability (number of sheets) | Press Life (number of sheets) |
|---|---|---|---|---|---|---|---|
| | Aqueous Sodium No. 3 Silicate Solution | | | Amount of Si Element Attached (mg/m$^2$) | | | |
| | Concentration (%) | Temperature (%) | Dipping Time of Aluminum Plate | | | | |
| Example 1 | 1.0 | 30 | 60 sec | 4.6 | (1) | 20 | 3,000 |
| Example 2 | 1.0 | 30 | 60 sec | 4.6 | (2) | 100 | 4,500 |
| Example 3 | 2.5 | 50 | 60 sec | 8.2 | (2) | 40 | 4,000 |
| Example 4 | 1.0 | 28 | 12 sec | 2.7 | (2) | 150 | 5,000 |
| Comparative Example 1 | not treated | not treated | not treated | not treated | (1) | 300 or more | — |
| Comparative Example 2 | not treated | not treated | not treated | not treated | (2) | On-Press development was impossible. | — |
| Comparative Example 3 | 2.0 | 7.0 | 10 sec | 12 | (1) | Ink adherence was failed. | — |
| Comparative Example 4 | 2.0 | 7.0 | 10 sec | 12 | (2) | Ink adherence was failed. | — |

Comparative Example 4

On the aluminum support subjected to the same silicate treatment as in Comparative Example 3, Coating Solution (2) for Image-Recording Layer was bar-coated and dried in an oven at 100° C. for 60 seconds to form an image-recording layer having a dry coated amount of 1.0 g/m$^2$, thereby obtaining a lithographic printing plate precursor.

2. Exposure and Printing

The obtained lithographic printing plate precursors each was exposed by Trendsetter 3244VX (manufactured by Creo) having mounted thereon a water cooling 40 W infrared ray semiconductor laser, under such conditions that the output was 9 W, the rotary number of outer surface drum was 210 rpm and the resolution was 2,400 dpi. A fine line chart was contained in the exposed image. Thereafter, without It is seen from the results above that the silicate-treated lithographic printing plate precursor of the present invention has good on-press developability and good press life.

The lithographic printing plate precursor having a uniform film-type image-recording layer using Coating Solution (2) for Image-Recording Layer was not on-press developed at all without alkali metal silicate treatment, but as the amount of Si element attached was increased, the on-press developability was greatly improved. The litho-graphic printing plate precursor having a microcapsule-type image-recording layer using Coating Solution (1) for Image-Recording Layer was also improved in the on-press developability by the alkali metal silicate treatment. Whichever coating solution for image-recording layer was used, when the amount of Si element attached is 10 mg/m$^2$ or more, the adhesion between the aluminum support and the image-recording layer in the image area was decreased, as a result, the ink adhesion failure in the image area accompanying the progress of printing occurred early and the press life was decreased.

According to the present invention, a lithographic printing plate precursor having good on-press develop-ability and good press life, and a lithographic printing method of performing printing by on-press developing this lithographic printing plate precursor can be obtained.

The entire disclosure of each and every foreign patent application from which the benefit of foreign priority has been claimed in the present application is incorporated herein by reference, as if fully set forth.

What is claimed is:

1. A lithographic printing plate precursor comprising:

an aluminum support that has been subjected to an alkali metal silicate treatment; and an image-recording layer comprising (A) an infrared absorbent, (B) a polymerization initiator and (C) a polymerizable compound, the image-recording layer being removable with at least one of a printing ink and a fountain solution, wherein the aluminum support has a surface where the amount of elemental Si attached to the surface in the alkali metal silicate treatment is 1 $mg/m^2$ to less than 10 $mg/m^2$.

2. The lithographic printing plate precursor according to claim 1, wherein elemental Si is attached to the surface of the aluminum support in an amount of 2 $mg/m^2$ to less than 10 $mg/m^2$.

3. The lithographic printing plate precursor according to claim 1, wherein elemental Si is attached to the surface of the aluminum support in an amount of 3 $mg/m^2$ to less than 10 $mg/m^2$.

4. The lithographic printing plate precursor according to claim 1, wherein the aluminum support has a center line average roughness Ra of 0.10 to 1.2 μm.

5. The lithographic printing plate precursor according to claim 1, wherein the aluminum support has a color density of 0.15 to 0.65.

6. The lithographic printing plate precursor according to claim 1, wherein the image-recording layer is directly on the alkali metal silicate treated aluminum support.

7. A lithographic printing method comprising:

loading a lithographic printing plate precursor according to claim 1 on a printing press;

imagewise exposing the lithographic printing plate precursor with an infrared laser to form an infrared laser-exposed portion and an infrared laser-unexposed portion of the image-recording layer; and printing by supplying a printing ink and a fountain solution to the lithographic printing plate precursor to remove the infrared laser-unexposed portion.

8. The lithographic printing method according to claim 7, wherein the loading is performed before the imagewise exposing.

9. The lithographic printing method according to claim 7, wherein the loading is performed after the imagewise exposing.

10. A lithographic printing plate precursor comprising:

(i) an alkali metal silicate treated aluminum support having a surface where the amount of elemental silicon from the alkali metal silicate attached to the surface of the support is between about 1 $mg/m^2$ and about 10 $mg/m^2$; and (ii) an image-recording layer comprising:

(A) an infrared absorbent, (B) a polymerization initiator; and (C) a polymerizable compound, the image-recording layer being removable with printing ink and/or a fountain solution.

11. The precursor of claim 10, wherein the infrared absorbent (A) constitutes means for forming an image using, as a light source, a laser emitting an infrared ray at 760 to 1,200 nm.

12. The precursor of claim 10, wherein the infrared absorbent (A) constitutes means for converting any absorbed infrared ray energy into heat.

13. The precursor of claim 10, wherein the infrared absorbent (A) has an absorption maximum in the wavelength range from 760 to 1,200 nm.

14. The precursor of claim 10, wherein the polymerization initiator (B) constitutes means for generating a radical and thereby initiating a curing reaction of the polymerizable compound (C).

15. The precursor of claim 10, wherein the polymerization initiator (B) generates a radical when the polymerization initiator (B) decomposes under the influence of heat.

16. The precursor of claim 10, wherein the polymerizable compound (C) is an addition-polymerizable compound having at least one ethylenic unsaturated double bond.

17. The precursor of claim 10, wherein the polymerizable compound (C) is an addition-polymerizable compound selected from the group consisting of: acrylic acid, methacrylic acid, itaconic acid, crotonic acid, isocrotonic acid, maleic acid, esters thereof, amides thereof, unsaturated phosphonic acid, styrene, vinyl ether and mixtures thereof.

* * * * *